United States Patent
Kishimoto et al.

(10) Patent No.: US 7,510,975 B2
(45) Date of Patent: Mar. 31, 2009

(54) METHOD FOR MANUFACTURING A SEMICONDUCTOR DEVICE HAVING TRENCHES DEFINED IN THE SUBSTRATE SURFACE

(75) Inventors: Daisuke Kishimoto, Nagano (JP); Hitoshi Kuribayashi, Nagano (JP); Yuji Sano, Nagano (JP); Akihiko Ohi, Nagano (JP); Yoshihiko Nagayasu, Nagano (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 437 days.

(21) Appl. No.: 11/233,377

(22) Filed: Sep. 23, 2005

(65) Prior Publication Data

US 2006/0154438 A1    Jul. 13, 2006

(30) Foreign Application Priority Data

Jan. 11, 2005    (JP) .............................. 2005-003954

(51) Int. Cl.
*H01L 21/302*    (2006.01)

(52) U.S. Cl. .................. 438/706; 438/287; 438/270; 438/424; 257/E21.002

(58) Field of Classification Search ................. 438/287, 438/424, 270, 706
See application file for complete search history.

(56) References Cited

U.S. PATENT DOCUMENTS

| | | | | |
|---|---|---|---|---|
| 6,313,010 B1 * | 11/2001 | Nag et al. | ............ | 438/435 |
| 6,333,232 B1 * | 12/2001 | Kunikiyo | ............ | 438/296 |
| 6,511,888 B1 * | 1/2003 | Park et al. | ............ | 438/296 |
| 6,548,371 B2 * | 4/2003 | Fujimaki | ............ | 438/424 |
| 6,864,532 B2 * | 3/2005 | Aoki et al. | ............ | 257/330 |
| 6,943,075 B2 * | 9/2005 | Joo | ............ | 438/211 |
| 7,148,120 B2 * | 12/2006 | Chen et al. | ............ | 438/421 |
| 7,183,600 B2 * | 2/2007 | Kim et al. | ............ | 257/295 |

FOREIGN PATENT DOCUMENTS

| | | |
|---|---|---|
| JP | 10-012716 | 1/1998 |
| JP | 2000-164691 | 6/2000 |
| JP | 2002-124474 | 4/2002 |
| JP | 2002-141407 | 5/2002 |

OTHER PUBLICATIONS

"Formation of SON (silicon on nothing) structure using surface migration of silicon atoms", Oyo Buturi (2000), vol. 69, No. 10, pp. 1187-1191.

* cited by examiner

*Primary Examiner*—Zandra V. Smith
*Assistant Examiner*—Christy L Novacek
(74) *Attorney, Agent, or Firm*—Rabin & Berdo, P.C.

(57) ABSTRACT

In the method for manufacturing a semiconductor device according to the invention including the step of forming trenches having the depth thereof in perpendicular to the major surface of a semiconductor substrate, the step of forming trenches includes the steps of performing trench etching using an insulator film, formed on the major surface of the semiconductor substrate and shaped with a predetermined pattern, for a mask to form the trenches; etching the inside of the trenches using a halogen containing gas to smoothen the inside of the trenches; and thermally treating in a non-oxidizing and non-nitriding atmosphere. The manufacturing method according to the invention facilitates well removing the etching residues remaining in the trenches and rounding the trench corners properly when the trenches are 2 μm or narrower in width and even when the trenches are 1 μm or narrower in width.

14 Claims, 11 Drawing Sheets

Fig. 1.1
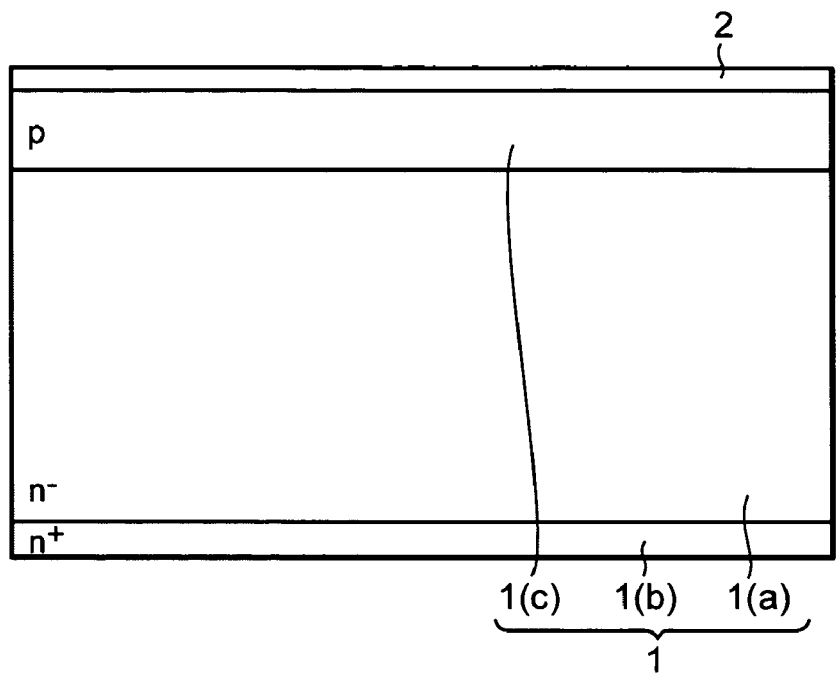
Fig. 1.2
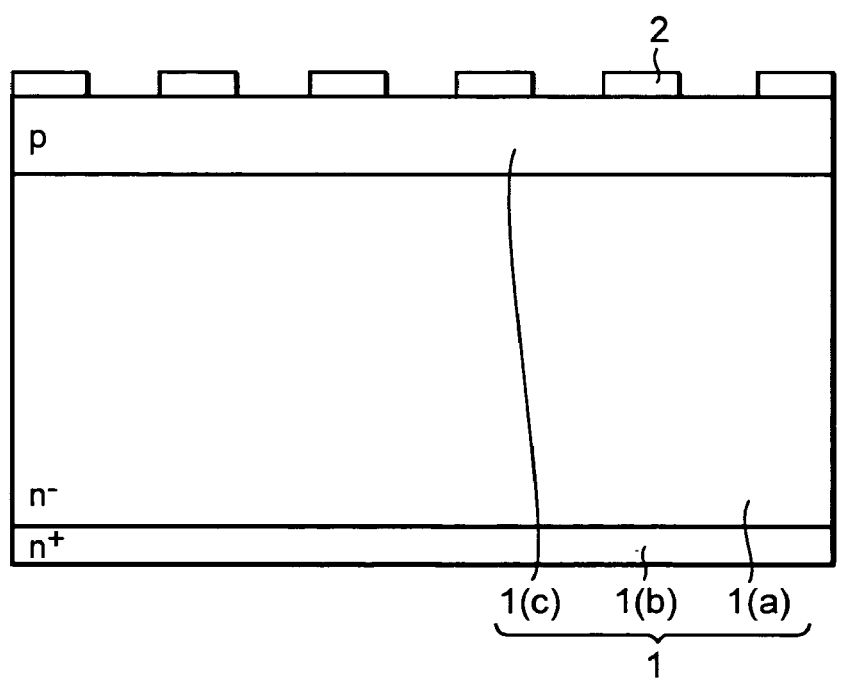

Fig. 1.3
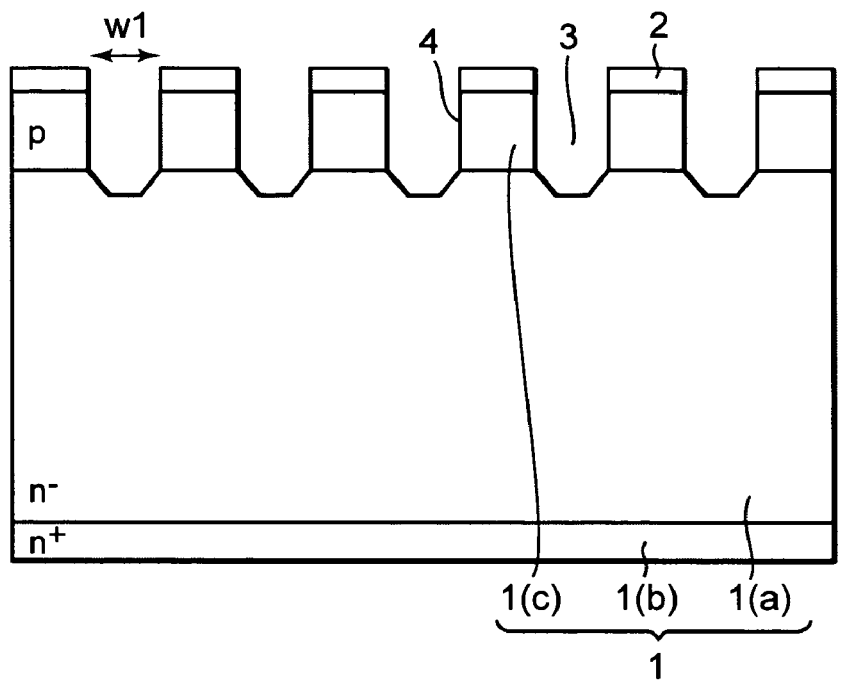
Fig. 1.4
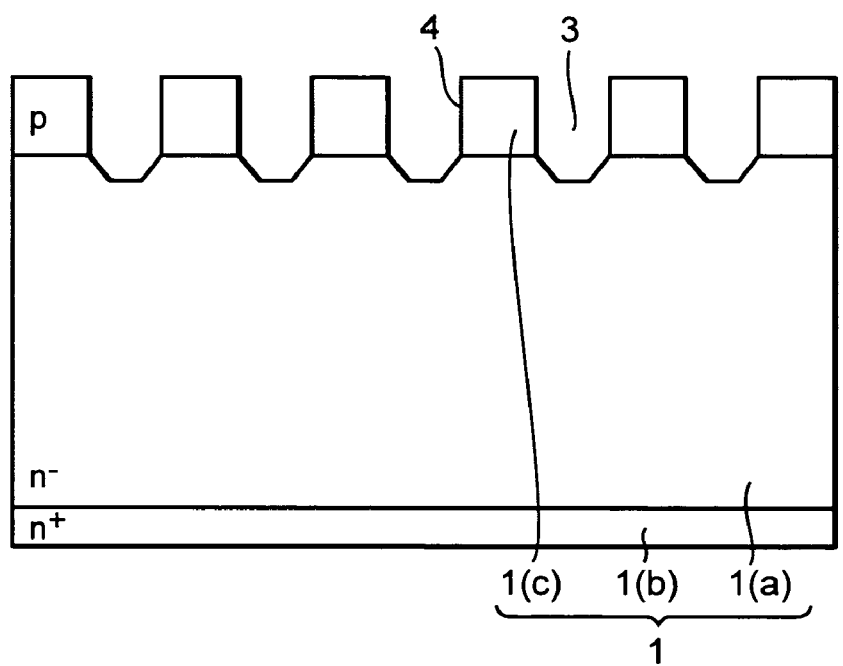

Fig. 1.5
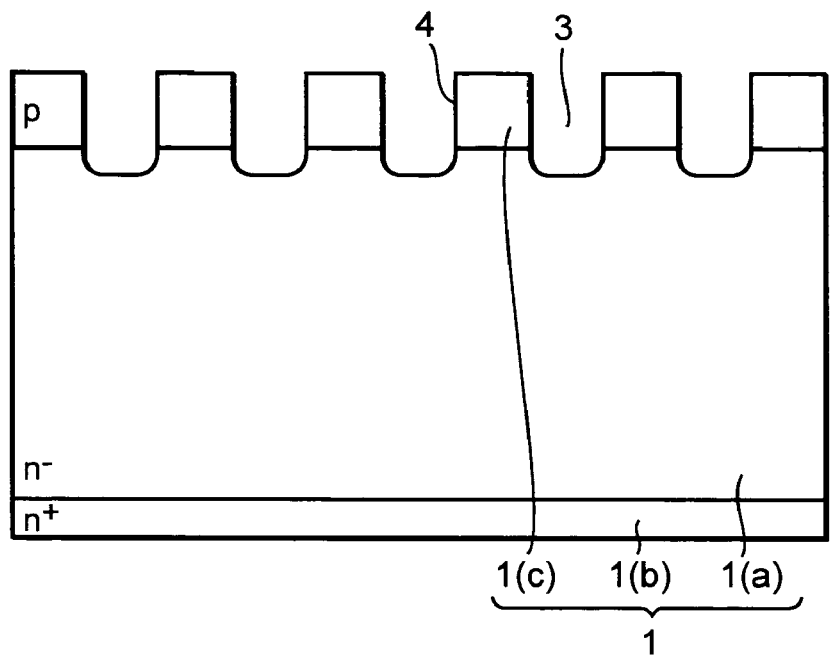
Fig. 1.6
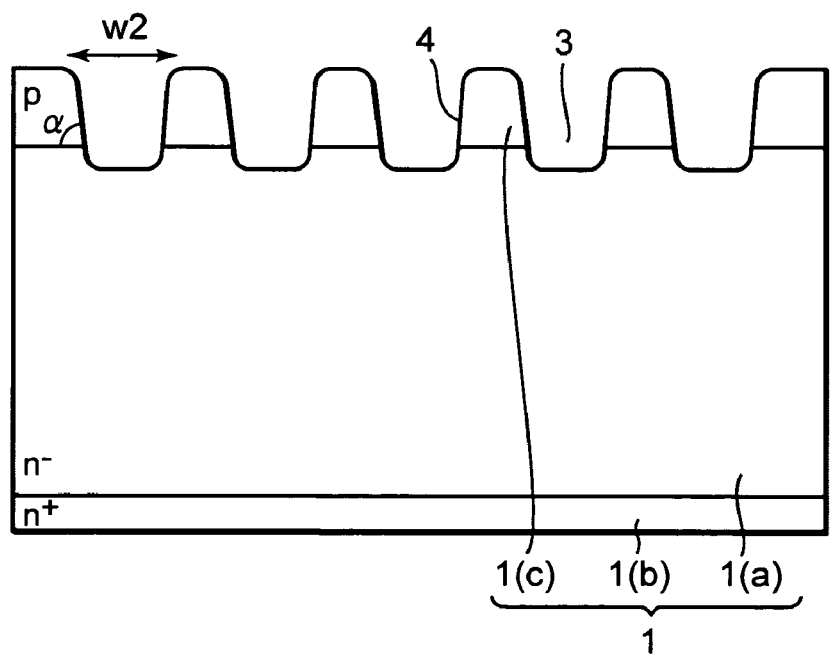

Fig. 1.7
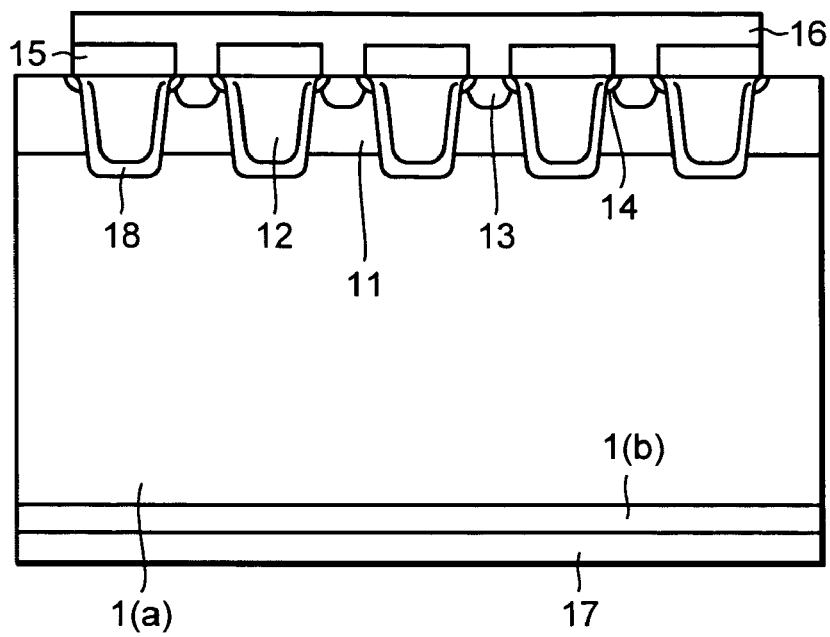
Fig. 1.8
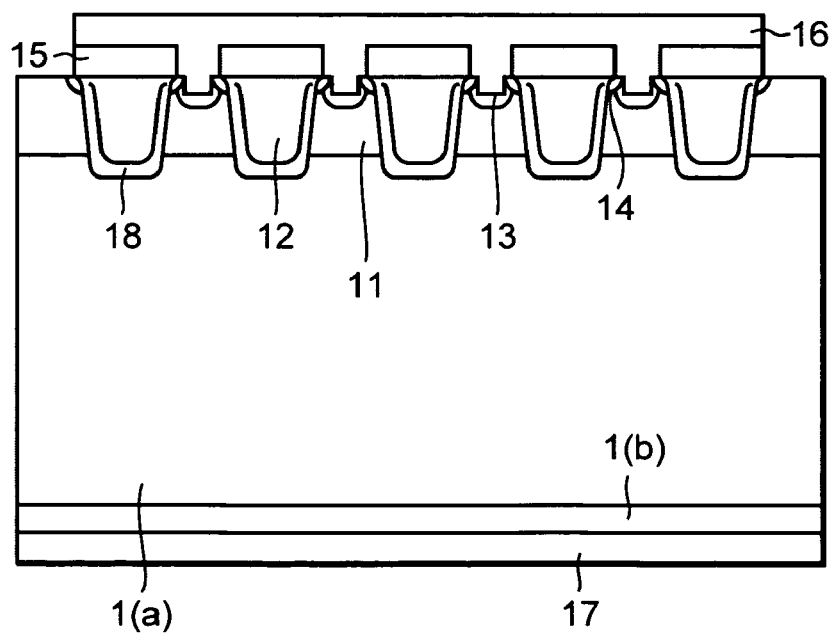

Fig. 2
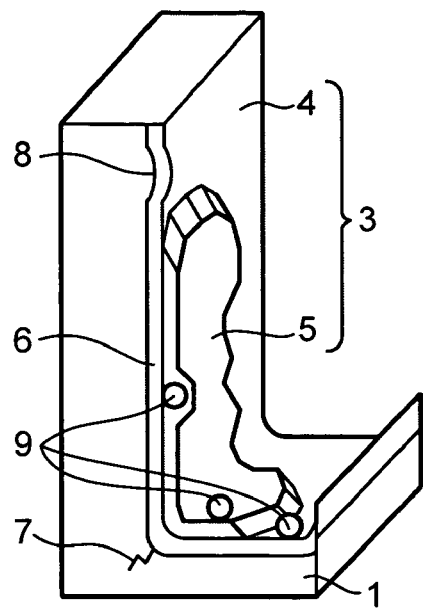
Fig. 3.1
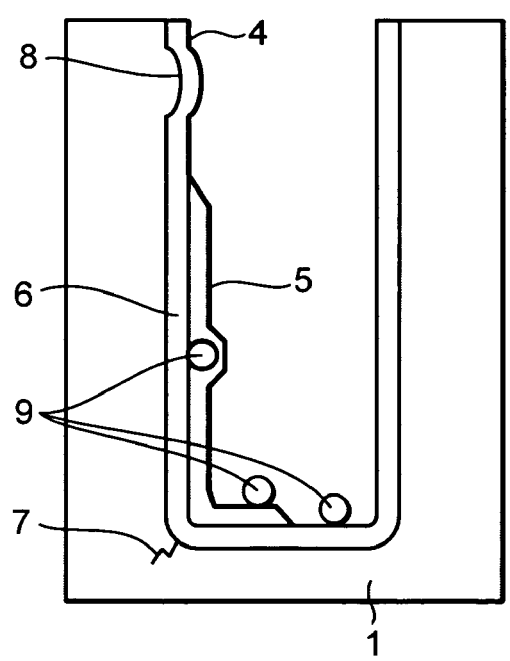

Fig. 3.2
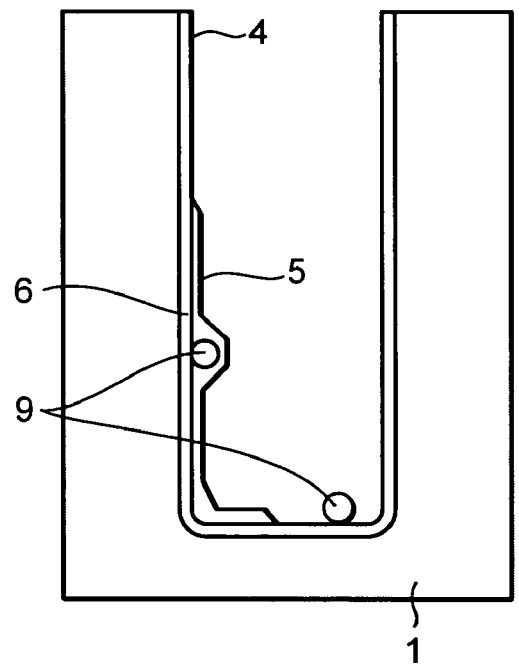
Fig. 3.3
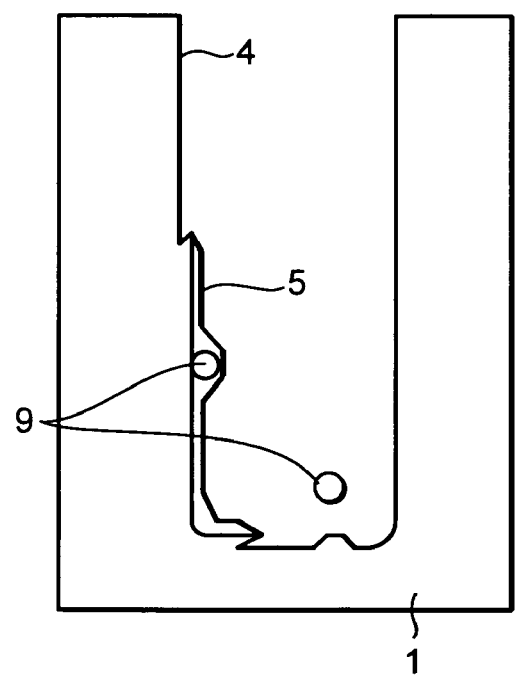

Fig. 3.4
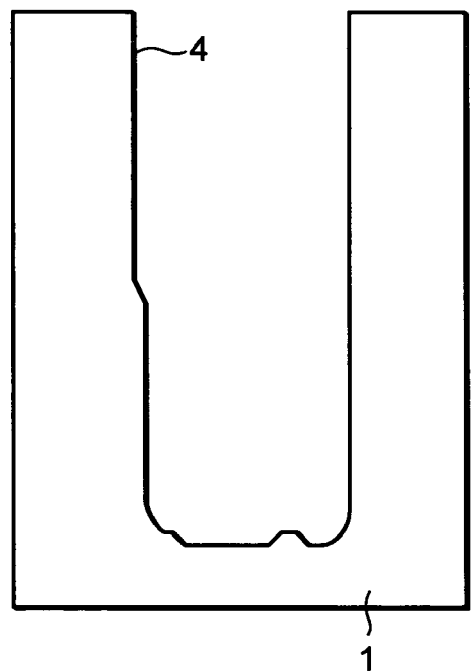
Fig. 3.5
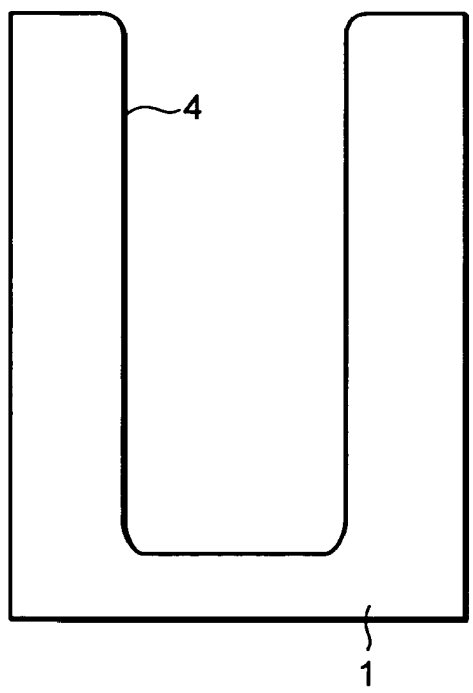

2 μm

METHOD FOR MANUFACTURING A SEMICONDUCTOR DEVICE HAVING TRENCHES DEFINED IN THE SUBSTRATE SURFACE

CROSS-REFERENCE TO RELATED FOREIGN APPLICATION

This application corresponds to applicants' Japanese Patent Application Serial No. 2005-003954, filed Jan. 11, 2005, the disclosure of which is incorporated herein by reference.

FIELD OF THE INVENTION

The invention relates to a method for manufacturing semiconductor devices that employ a trench technique such as a trench-type insulated gate, a trench capacitor, or a trench device separation. Specifically, the invention relates to a method for manufacturing semiconductor devices having a trench-type insulated gate structure formed by an improved method, such as metal oxide semiconductor field effect transistors (hereinafter referred to as "MOSFETs"), insulated gate bipolar transistors (hereinafter referred to as "IGBTs"), and insulated gate thyristors.

BACKGROUND OF THE INVENTION

For realizing very efficient electric power control, the markets have been requiring a reduction in conduction losses, i.e. a reduction in the on-resistance, of semiconductor devices for electric power control, which are the so-called power semiconductor devices. For reducing the on-resistance in the power MOSFETs and the power IGBTs, the cells in the active section of the semiconductor substrate (chip), through which a main current flows, are made smaller such that the cell pitch in the semiconductor chip is narrow.

The semiconductor devices described above have a planar MOS gate structure formed along the major surface of the semiconductor chip. Power semiconductor devices such as trench MOSFETs and trench IGBTs that facilitate reducing the on-resistance greatly have been known. The trench MOSFETs and the trench IGBTs have a trench MOS gate structure. The trench MOS gate structure includes trenches formed in a semiconductor substrate, which extend perpendicularly to the major surface thereof and a gate electrode buried in each of the trenches with a gate insulator film interposed between the gate electrode and the trench. The trench MOS gate structure facilitates forming channels in the surface portions of the semiconductor substrate on both sides of the trenches such that the channels are facing the gate electrodes. The trench MOS gate structure, which facilitates forming channels as described above, has facilitated an epoch-making narrowing of the cell pitch and a great reduction of the on-resistance.

For further minimizing the cells and for further increasing the cell density in the trench MOS gate structure described above, it is necessary to establish reliable techniques for reducing the trench width. However, the conventional techniques for reducing the trench width pose many problems. For forming fine trenches, narrower than 2 μm in width, especially narrower than 1 μm in width, and around 6 μm in depth, it is difficult to control the shape of the trenches, to remove the crystal defects caused in the trench inner walls, to remove the etching residues left in the trenches, and to clean the inside of the trenches, posing new problems. In detail, when the inner surfaces of the trenches are treated using a dilute solution of hydrofluoric acid and such a chemical reagent, it is difficult for the dilute solution to reach deep into the depth of the trenches. It is also difficult for the pure water used for washing subsequently to the surface treatment to reach into the depth of the trenches. In the drying step subsequent to the etching step, it is difficult to purge the chemical solution or the pure water described above from the trenches. If the trenches are not washed well, the residues and the crystal defects remaining in the trenches lower the breakdown voltage of the gate insulator films and impair the reliability of the gate insulator films, since the gate electrodes are formed in the trenches, in which the residues and the crystal defects are remaining, with the respective gate insulator films interposed between the gate electrodes and the trenches. Low breakdown voltage and low reliability of the gate insulator films due to the remaining residues and crystal defects, pose serious problems to be obviated, especially for minimizing the trenches so that the width thereof may be 1 μm or narrower.

In forming the trenches with a width of 1 μm or narrower, the gate breakdown voltage is lowered and the reliability thereof is impaired due to the poor cleaning of the trench interiors. In addition, it is more difficult to control the shape of the trenches, whose widths are 1 μm or narrower, than to control the shape of the conventional trenches, whose widths are wider than 1 μm. When the trench has the conventional shape, 1 or 2 μm wider in width, the electric field is liable to localize at the trench corners, which impairs the breakdown voltage due to the angularity of the trench corners. It has been known that excellent results are obtained for preventing the breakdown voltage and the reliability of the gate from being impaired, by rounding the trench corners and smoothing trench surfaces roughened by the etching, using a heat treatment technique in a non-nitriding and non-oxidizing atmosphere, for example a heat treatment technique in a hydrogen atmosphere. Such a heat treatment technique is described in OYO BUTURI (a Japanese monthly publication of The Japan Society of Applied Physics) (2000), Vol. 69, No. 10, pp. 1187-1191. This technique facilitates smoothing the surface roughness of a 100 nm level to the surface roughness of a 10 nm level. The OYO BUTURI publication describes the heat treatment technique in a hydrogen atmosphere to be effective for trench shaping control. The OYO BUTURI publication reports also that it is possible for this above-described heat treatment technique to reduce the crystal defects and to remove the oxide residues of $SiO_X$ to some extent. However, this above-described heat treatment technique poses problems when the trenches are 2 μm or narrower in width and especially when the trenches are 1 μm or narrower in width (Again, see, for example, the OYO BUTURI publication.

Similar techniques known to those skilled in the art include annealing in a non-oxidizing atmosphere above 800° C. and a performing a heat treatment in a low pressure hydrogen atmosphere. It is expected that annealing in a non-oxidizing atmosphere above 800° C. rounds the trench corners and that the heat treatment in the low pressure hydrogen atmosphere smoothes the trench inner surfaces roughened by reactive ion etching (hereinafter referred to as "RIE") (See Japanese Patent Publication JP P Hie. 10 (1998)—12716 A (claim 1), and Japanese Patent 3424667 (Paragraphs 0028 and 0029)). It is also described in Japanese Patent 3424667 that the residues in the trenches are removed by washing with a mixture of sulfuric acid and hydrogen peroxide and by subsequent washing with hydrofluoric acid. Also described is a technique for controlling the taper angle of trench inner walls in forming trenches by using first an etching gas mixture of a hydrogen halide and oxygen and, then, a gas mixture of a halogen containing gas and oxygen. Smoothing the trench inner surfaces also is described. However, the problems described above also are posed on the taper angle control and the trench inner surface smoothing when the trench is 2 μm or narrower in width and especially when the trench is 1 μm or narrower in width (See Japanese Patent Publication JP-P 2002-141407 A (Claim 7, Paragraph 0043)).

Summarizing the problems described above, it has been made clear that some residues remain unremoved from the trench when subjected only to a heat treatment in a low pressure hydrogen atmosphere, or other treatment techniques described above, when the trench is 2 μm or narrower in width and especially when the trench is 1 μm or narrower in width, and that these conventional techniques are not always satisfactory for washing the inside of the trench. The conventional techniques exhibit a very weak or no effect for removing the residues other than the $SiO_X$ residues such as amorphous silicon and the particles of oxide films peeled off. Adversely affected by the difficulties caused in removing the residues, it is also difficult for the conventional technique to round the trench corners. Therefore, how to thoroughly remove the difficult residues has posed a serious problem for trench downsizing.

In view of the foregoing, it would be desirable to provide a method for manufacturing semiconductor devices that facilitates adequate and proper removal of etching residues in the trenches and proper rounding of trench corners when the trench width is 2 μm or narrower in width and even when the trench width is 1 μm or narrower in width.

SUMMARY OF THE INVENTION

According to an aspect of the invention, there is provided a method for manufacturing a semiconductor device with trenches in the major surface of a semiconductor substrate. Forming the trenches includes trench etching using an insulator film, formed on the major surface of the semiconductor substrate and shaped with a predetermined pattern, for a mask to form the trenches.

The inside of the trenches is etched using a halogen containing gas to smooth the inside of the trenches. A first thermal treatment is performed in a non-oxidizing and non-nitriding atmosphere.

Advantageously, the step of forming the trenches further includes the second step of thermally treating in a non-oxidizing and non-nitriding atmosphere, the second step of thermally treating being performed between the step of performing trench etching and the step of etching the inside of the trenches.

Advantageously, the trenches are 2.0 μm or narrower in width and 0.5 μm or deeper in depth.

Advantageously, the trenches are 1.0 μm or narrower in width.

Advantageously, the trench etching is performed by anisotropic dry etching.

Advantageously, the halogen containing gas is hydrogen chloride gas or chlorine gas.

Advantageously, the step of etching the inside of the trenches uses hydrogen for a carrier gas and etches the inside of the trenches in an atmosphere under a pressure between 100×133.3 Pa and 760×133.3 Pa and at a temperature between 900° C. and 1050° C.

Advantageously, the taper angle of the sidewalls of the trenches after the step of etching the inside of the trenches is between 87 degrees of angle and 90 degrees of angle.

Advantageously, the first step of thermally treating or the second step of thermally treating is performed in a carrier gas atmosphere under a pressure of 760×133.3 Pa or lower and at a temperature between 900° C. and 1050° C.

Advantageously, the first step of thermally treating and the second step of thermally treating are performed in a carrier gas atmosphere under a pressure of 760×133.3 Pa or lower and at a temperature between 900° C. and 1050° C.

Advantageously, the method further includes the steps of: forming a sacrificial oxide film on the trench inner wall and removing the sacrificial oxide film, the step of forming the sacrificial oxide film being performed subsequently to the first step of thermally treating; and forming a gate oxide film on the trench inner wall.

Advantageously, the atmosphere gas used in the first step of thermally treating and the second step of thermally treating is a gas selected from the group consisting of hydrogen, argon, and helium.

Advantageously, the gate oxide film is a silicon oxide film.

Advantageously, the gate oxide film is a laminate including a silicon nitride film.

Advantageously, the substrate is rotated.

The manufacturing method according to the invention facilitates well removing the etching residues in the trenches and rounding the trench corners properly when the trenches are 2 μm or narrower in width and even when the trenches are 1 μm or narrower in width.

BRIEF DESCRIPTION OF THE DRAWINGS

FIGS. 1.1 through 1.8 are cross-sectional views of a semiconductor chip describing the manufacturing steps for manufacturing a trench-gate-type MOSFET according to a first embodiment of the invention.

FIG. 2 is an expanded perspective view of a part of the trench showing residues remaining therein.

FIGS. 3.1 through 3.5 are cross-sectional views describing the steps for removing the residues in the trench and for rounding the trench corners.

DETAILED DESCRIPTION OF THE PREFERRED EMBODIMENTS

The invention will be described in detail hereinafter with reference to the accompanied drawing figures that illustrate the preferred embodiments of the invention. Although the manufacturing method according to the invention will be described in connection with the manufacture of a trench-gate-type MOSFET, changes and modifications are obvious to those skilled in the art without departing from the true spirit of the invention. Therefore, the invention is to be understood not by the specific descriptions of the embodiments thereof but by the appended claims thereof.

Figure 4:
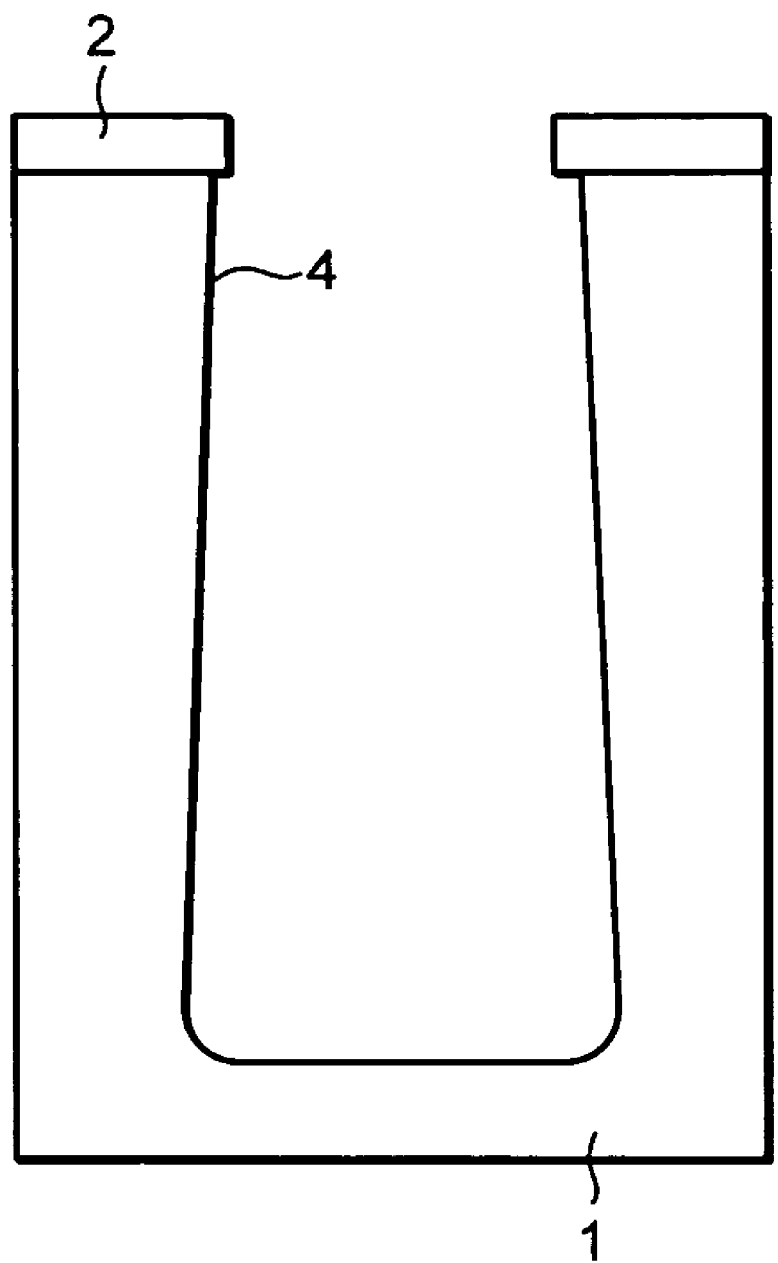
FIG. 4 is a perspective view of the trench bowing due to over-etching caused after the trench formation.
Figure 5B:
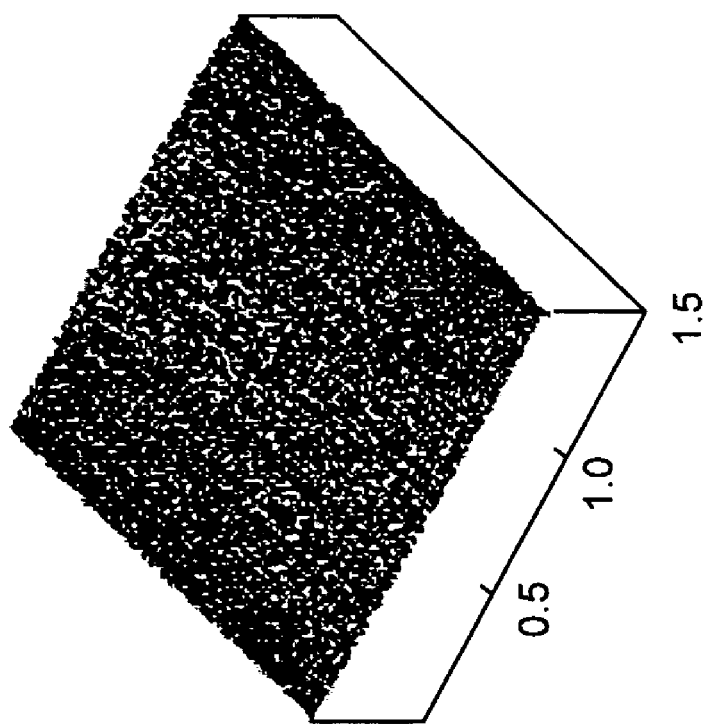
FIGS. 5A and 5B show AFM photographs comparing the surface states in the trench immediately after the trench etching and after the treatments according to the invention are performed.
Figure 5A:
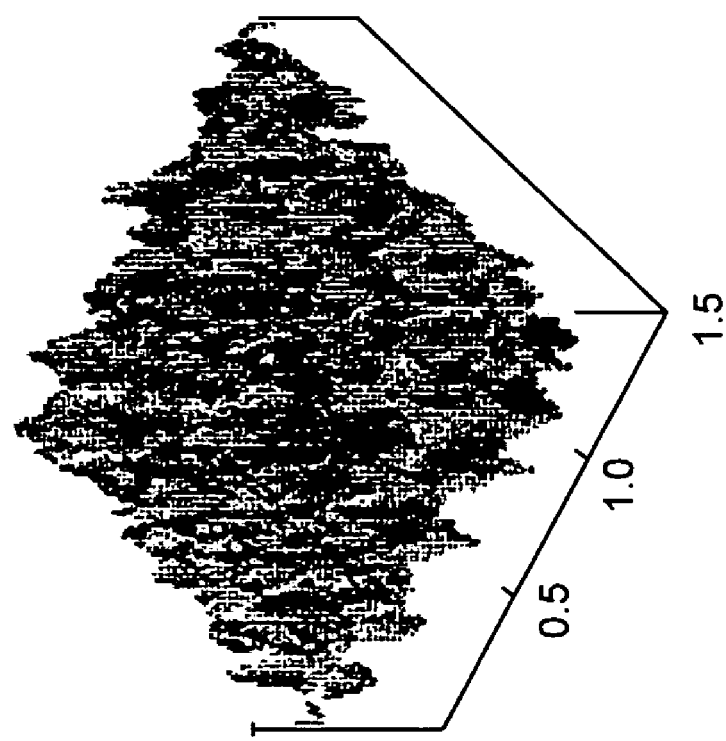
Figure 6A:
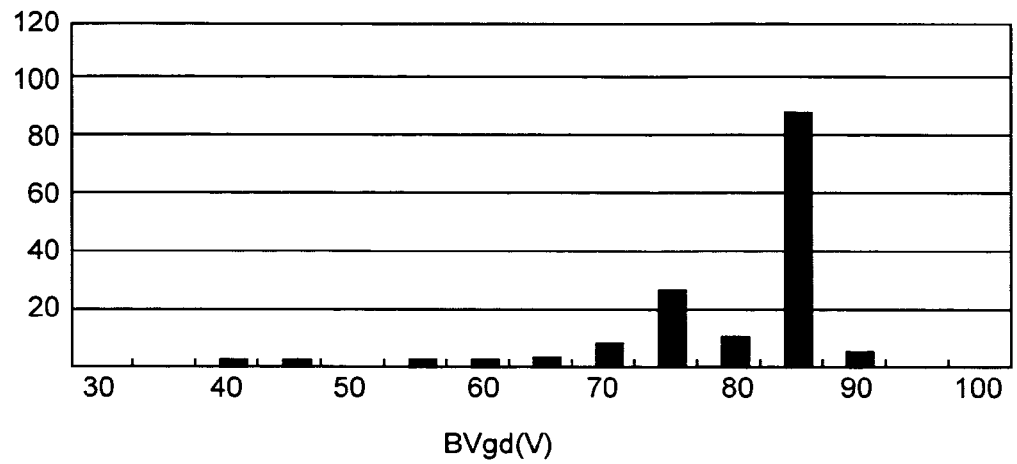
FIGS. 6A and 6B are histograms comparing the distributions of the gate breakdown voltages according to the conventional technique and according to the invention.
Figure 6B:
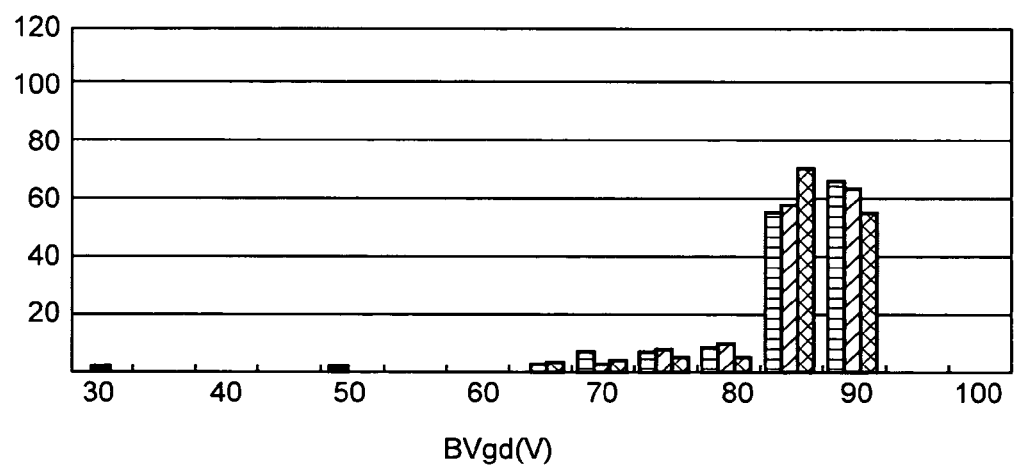
Figure 7:
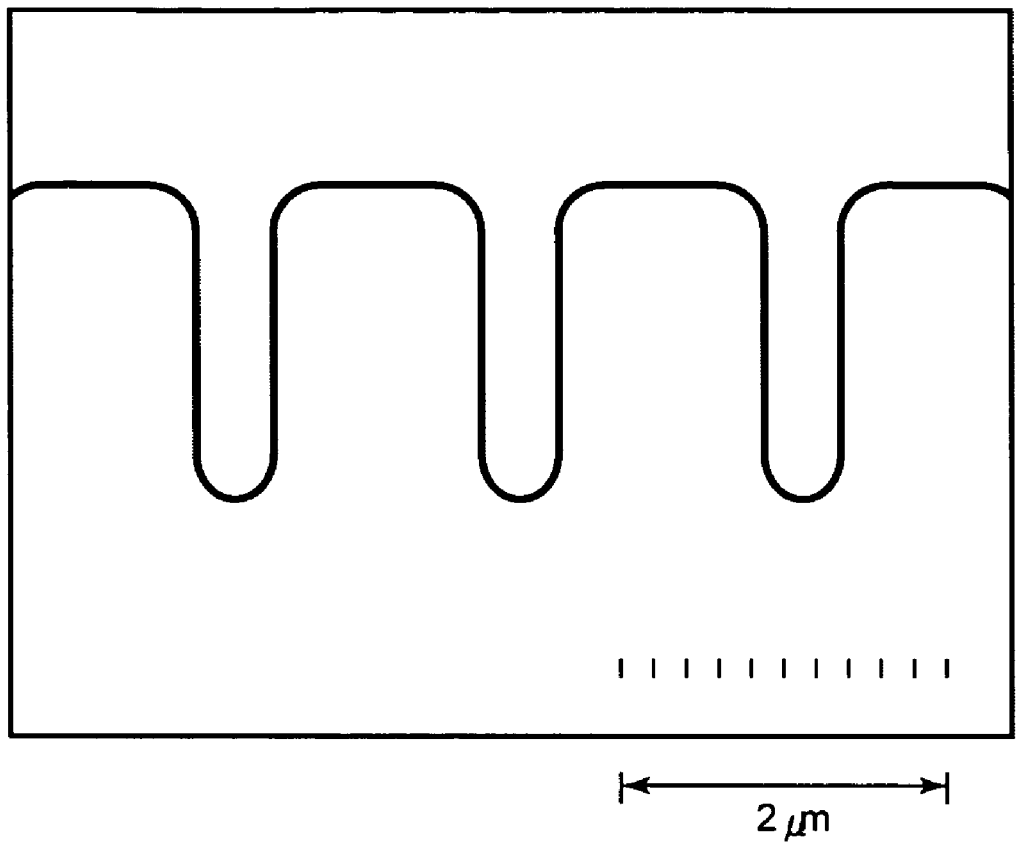
FIG. 7 is a drawing showing the trench cross sections obtained from an SEM photograph.

FIGS. 1.1 through 1.8 are cross-sectional views of a semiconductor substrate describing the manufacturing steps for manufacturing a trench-gate-type MOSFET. FIG. 2 is a perspective view of a trench showing residues remaining in the trench. FIGS. 3.1 through 3.5 are cross-sectional views of the trench describing the steps for removing the residues in the trench and for rounding the trench corners. FIG. 4 is a perspective view of the trench bowing due to over-etching caused after the trench formation. FIGS. 5A and 5B show AFM photographs comparing the surface states in the trench immediately after the trench etching and after the treatments according to the invention are performed. FIGS. 6A and 6B are histograms comparing the distributions of the gate breakdown voltages according to the conventional technique and according to the invention. FIG. 7 is a drawing showing the trench cross sections obtained from an SEM photograph.

First Embodiment

Now the manufacturing method according to a first embodiment of the invention will be described in connection with the manufacture of a trench-gate-type MOSFET with reference to FIGS. 1.1 through 1.8. Referring now to FIG. 1.1, an n-type silicon substrate 1 including a base portion 1(b) with low electrical resistance and a surface portion 1(a) with high electrical resistance is prepared. A p-type region 1(c) is formed on a very resistive surface portion 1(a) of silicon substrate 1. Then, an oxide film is formed for a mask 2 on p-type region 1(c) by thermal oxidation or by CVD. An insulator film such as a silicon oxide film and a silicon nitride film may be used for mask 2. Referring now to FIG. 1.2, windows for forming trenches are opened through oxide film mask 2 by photolithography. The planar pattern of the windows is shaped with stripes or a planar lattice.

Referring now to FIG. 1.3, trenches 3 are formed in silicon substrate 1 using oxide film mask 2. Trenches 3 are formed by plasma etching that exhibits anisotropy, reactive ion etching (RIE) that exhibits anisotropy, anisotropic wet etching or other such an anisotropic etching technique. In the MOSFET, the target trench width w1 is from 0.35 to 0.5 µm and the target trench depth is from 1.5 to 3 µm in the stage shown in FIG. 1.3. For the IGBT, the trench depth is a little bit deeper than the trench depth of the MOSFET, and preferably around 5 µm. Although the trench depth is different from semiconductor device to semiconductor device, the manufacturing method according to the invention is effective for the trench depth of 0.5 µm or deeper. The trench etching according to the invention exhibits remarkable effects for forming the trench deeper than the conventional trench by 1.5 µm or more.

The orientation for which anisotropic wet etching is employable, is defined by the chemical properties of the etchant and the anisotropy of silicon crystal plane orientations. As a result, the degree of freedom for device design becomes extremely low. In contrast, anisotropic dry etching such as RIE and plasma etching facilitates determining the etching direction based on the directivity of an ion beam or a plasma. Since anisotropic dry etching is free from the restrictions caused by the chemical properties and the crystal plane orientations, the degree of freedom for device design becomes high. Therefore, anisotropic dry etching is preferable for the trench etching according to the invention.

However, anisotropic dry etching is liable to cause silicon oxide (SiO) residues 5 on a trench inner wall 4, amorphous silicon 6, crystal damage 7, and surface roughness 8, as shown in FIG. 2. To obviate this problem, the following step is performed. The trenches are washed with hydrofluoric acid, dilute hydrofluoric acid, or buffered hydrofluoric acid and, then, with pure water. Then, the washed trenches are dried. Oxide film mask 2 may be removed or left unremoved prior to the trench washing, depending on the order of subsequent steps. Since whether oxide film mask 2 is left or not left has no relation with the subject matters of the invention, the following descriptions will be made with reference to FIG. 1.4, in which oxide film mask 2 are shown to have been removed.

Most of oxide residues 5 in the trench are removed by the hydrofluoric acid washing agent. The trench may be washed further by RCA washing (consisting of washing with hydrofluoric acid, washing with hydrogen peroxide, and rinsing with ultrapure water). The foregoing amorphous silicon 6 and particles 9 of oxide films peeled off are not well removed often by the washing described above, when the trench width is 2 µm or narrower and especially when the trench width is 1 µm or narrower. In the process of washing with pure water and drying, the oxygen dissolved in the pure water and some oxygen atoms in the water molecules react with the silicon surface, causing oxide residues 5 again to be formed. These oxide residues 5 remain on trench inner wall 4, posing another problem. Since the terminal end of the trench is a location to which water drops and foregoing particles 9 are liable to localize by the centrifugal force generated when the silicon substrate is spin-dried, the contamination poses a serious problem. As described earlier, these problems are more serious as the trench size is reduced and the trench width becomes narrower than 1 µm.

Now the foregoing problems will be described from the microscopic view point with reference to FIG. 2, which is a much enlarged perspective view of a part of the trench. In FIG. 2, the size of particles 9 falls mostly within the range between 0.01 µm and 0.1 µm. Particles around 1 µm in length would be considered exceptional. In FIG. 2, all the contamination factors are exaggerated in size. Particles 9 may be under oxide residues 6 or on oxide residues 6. Therefore, it is necessary for the surface washing technique to remove particles 9 irrespective of whether particles 9 are under or on the oxide residues 6. Various residues in the trench will remain unremoved in the trench as shown in FIG. 2, even if the presently available advanced surface treatment techniques such as washing with hydrofluoric acid, washing with pure water, sacrificial oxidation, plasma etching, and chemical dry etching (CDE) are fully employed. Therefore, the presently available techniques have no choice but to form a gate oxide film 18 on trench inner wall 4 with various residues remaining in the trench as shown in FIG. 2, impairing the breakdown voltage and the reliability of gate oxide film 18.

According to the invention, a silicon substrate 1 with many trenches formed therein and in the state shown in FIG. 2, is positioned in a vapor-phase reaction furnace. The vapor-phase reaction furnace is made, for example, of quartz containing few contaminants. The vapor-phase reaction furnace includes a heater for heating silicon substrate 1, a gas inlet, and a gas outlet. Usually, the vapor-phase reaction furnace, whose interior is kept under ordinary pressure and contains a hydrogen atmosphere (containing 30% of hydrogen and 70% of Ar), is heated to a temperature between 800° C. and 900° C. Silicon substrate 1 is annealed for an annealing period between 10 seconds and several minutes in a hydrogen atmosphere under ordinary pressure and at an annealing temperature between 900° C. and 1100° C. The annealing in a hydrogen atmosphere converts crystal damage 7 and amorphous silicon 6 back to crystalline silicon, reduces surface roughness 8 and removes oxide residues 5 by reduction. For removing oxide films, a higher hydrogen partial pressure is preferable. Since the trench is liable to be deformed by the surface diffusion of Si atoms under reduced pressure, ordinary pressure is preferable at this annealing stage. It is preferable for the hydrogen partial pressure to be 20% or higher. As a result, the cross section of the trench, in which the residues remain after the etching, as shown in FIG. 2, shifts from the initial state thereof shown in FIG. 3.1 to the state shown in FIG. 3.2, in which the residues are decreased. However, since the hydrogen annealing described above is a relatively mild reaction performed chemically in a reducing atmosphere, hydrogen annealing is not always able to wash the trench in the state shown in FIG. 2 as cleanly as expected. Annealing in the reducing atmosphere may be performed effectively not only in a gas mixture containing hydrogen but also in a gas that produces a non-oxidizing atmosphere or a non-nitriding atmosphere. The gas that produces a non-oxidizing atmosphere or a non-nitriding atmosphere includes Ar gas, He gas, and other such inert gases.

Then, a gas mixture containing hydrogen as its main component and a halogen containing gas such as HCl and chlorine gas at a preferable mixing ratio of 10% or more, is fed under ordinary pressure to the vapor-phase reaction furnace kept at the temperature described above to wash the trench inner surface using the strong etching action of HCl. Generally, the halogen elements such as Cl and Br exhibit a strong oxidizing function. Here, the term "oxidizing function" does not mean "providing an object with an oxygen atom" but rather means "depriving an object of an electron" according to the theory of chemical reactions (Nernst's definition). Usually, the oxidizing reaction is more vigorous than the reducing reaction. The oxidizing reaction exhibits a strong etching action to crystalline silicon and amorphous silicon 6, but a weak etching action to oxide residues 5. Particles 9 and oxide residues 5 are removed also by side etching. Therefore, the trench cross section shifts from the state shown in FIG. 3.2 to the state shown in FIG. 3.4 via the state shown in FIG. 3.3.

The steps of annealing and etching described above convert the silicon surface of trench inner wall 4 to a "clean surface" as surface science defines, resulting in an exposed silicon crystal plane including minimal contaminants and impurities. However, surface roughness remains in the locations where particles 9 and residues 5 were, as shown in FIG. 3.4. From several tens of nanometers (nm) to around 100 nm, height differences are caused in the rough surface. It is undesirable to form an electron device without removing the surface roughness as described above, since the manufacturing process will be unstable and the electrical properties will be adversely affected abruptly.

To obviate this problem, the surface roughness caused on trench inner wall 4 is reduced by annealing in a pure hydrogen gas under ordinary pressure. The hydrogen annealing conditions include ordinary hydrogen gas pressure and a silicon substrate temperature between 950° C. and 1050° C. When the substrate temperature is set at 1050° C., the annealing period is a maximum of 1 minute. If the hydrogen annealing is performed for longer than 1 minute, the silicon crystal will be deformed greatly as shown in FIG. 4 and a trench tapered in reverse having the so-called bowed shape will be created. A bow-shaped trench is hard to handle, since bubbles are liable to be formed in the subsequent step of burying a polysilicon electrode in the trench. When the silicon substrate temperature is as low as 950° C., the annealing treatment may be performed for several minutes, since it takes a long time for the silicon crystal to deform as shown in FIG. 4 due to the slow deformation thereof. By the hydrogen annealing, height differences in the rough surface of trench inner wall 4 are reduced to several nm or lower, which is one-tenth as high as the initial height differences. A height difference of several nm or lower is an extremely small value corresponding to 1 to 3 crystal lattice intervals, indicating the good smoothing effects of the hydrogen annealing. FIG. 5A shows an atomic force microscopic (AFM) image of the trench inner surface immediately after the trench etching and before the above-described treatments in the vapor-phase reaction furnace are performed. FIG. 5B shows an AFM image of the trench inner surface smoothed to the level of several atomic layers by the above-described treatments in the vapor-phase reaction furnace according to the invention. FIG. 7 is a drawing obtained from an SEM photograph, showing enlarged cross sections of the trenches. In FIG. 7, the length indicated by the double arrows is 2 μm. The drawing shows that the trench treated as described above is 0.5 μm in width.

The trenches having a smooth U-shaped cross section as shown in FIG. 3.5 or FIG. 7 are obtained by the steps described above. In FIG. 3.5 or FIG. 7, the trench aperture is rounded by the hydrogen annealing effects. The rounded trench aperture facilitates preventing electric field localization in the electron device and improving the breakdown voltage thereof. The reduction of surface roughness by the hydrogen annealing and the silicon crystal deformation are described in the previously mentioned OYO BUTURI publication.

Trench inner wall 4, the surface roughness of which is reduced by the step described above, has a so-called clean surface defined in surface science. After the hydrogen annealing is completed, the silicon substrate is taken out of the vapor-phase reaction furnace once. Although the silicon substrate is exposed to air, a natural oxide film, several nm in thickness and exhibiting an excellent quality, is formed on the surface of trench inner wall 4. This oxide film protects the surface of trench inner wall 4 from the other contamination sources provided that the air is as clean as it would be in the usual clean room. The washing of trench inner wall 4 and the rounding of the trench corners have been described from the microscopic point of view with reference to FIGS. 3.1 to 3.5 and FIG. 7. The macroscopic view corresponding to the microscopic view illustrated in FIG. 3.1 is illustrated in FIG. 1.4. In the same manner, the macroscopic view corresponding to the microscopic view illustrated in FIG. 3.5 is shown in FIG. 1.6.

Viewing the trenches macroscopically, it is seen from a comparison of FIGS. 1.4 and 1.5 that the bottom of the trenches are rounded a little bit by the first hydrogen annealing. Then, by the etching action of the halogen containing gas and by the subsequent second hydrogen annealing, the trenches are rounded further and tapered such that they become wider in an upward direction, as shown in FIG. 1.6. The tapered trenches becoming wider in the upward direction is advantageous since it facilitates prevention of voids when burying a gate electrode in the trench. The taper angle α is preferably between 87 and 90 degrees of angle. A taper angle α smaller than 87 degrees is not preferable because then the trench is too wide. If the taper angle α is larger than 90 degrees, air gaps may occur in the subsequent step of burying the gate electrode in the trench. Therefore a taper angle α larger than 90 degrees of angle should be avoided. The trench width w1 is in the range 0.35 μm to 0.5 μm in the stage shown in FIG. 1.3 and the trench width w2 after the second hydrogen annealing is between 0.5 μm and 0.7 μm.

A sacrificial oxide film of from several nm to 0.1 μm in thickness is formed on trench inner wall 4 and the sacrificial oxide film is removed. Hydrofluoric acid or other such reagent is used for removing the sacrificial oxide film and washing with pure water is also performed. Therefore, contamination factors are introduced again. However, since a clean surface is obtained once the workpiece is placed in the vapor-phase reaction furnace, contamination factors are caused only by the step of forming and removing the sacrificial oxide film and the contamination factors introduced in the preceding steps are prevented from accumulating. If substantial contamination is caused by the step of forming and removing the sacrificial oxide film, that step may be omitted.

The subsequent steps will be described only briefly, since the subsequent steps are unrelated with the surface cleaning of trench inner wall 4 and since the subsequent steps are steps well known in the manufacture of MOSFETs. A gate oxide film 18 is formed on trench inner wall 4. Trench 3 is filled with a doped-polysilicon gate electrode 12. Then, second $p^+$-type regions 13, $n^+$-type source regions 14, interlayer insulator films 15, a metal source electrode 16, and a drain electrode 17 are formed, resulting in a trench-gate MOSFET, the cross section of which is shown in FIG. 1.7. Since the invention is focused especially on the surface cleaning treatment of trench inner wall 4, the semiconductor device manufactured according to the invention is not limited to the MOSFET shown in FIG. 1.7. The invention is applicable also to all semiconductor devices having a trench-type gate insulator film, such as a MOSFET having a highly integrated structure obtained by increasing the source electrode contact area as shown in FIG. 1.8.

Second Embodiment

According to the second embodiment of the invention, the steps from the start to trench etching by anisotropic etching, and the subsequent trench washing as described with reference to FIG. 1.4, are performed in the same manner as according to the first embodiment. Although the hydrogen annealing is performed in the vapor-phase reaction furnace according to the first embodiment subsequently to the step of trench washing, according to the second embodiment the hydrogen annealing is not performed. According to the second embodiment, subsequent to the step of trench washing the trench corners are rounded and the trench sidewalls are flattened. First, annealing is performed in a mixed gas atmosphere containing hydrogen and HCl, which exhibits etching action on silicon. When the annealing temperature is 950° C., the mixed gas pressure is 760 Torr (760×133.3 Pa), and the HCl content is 30%, then a clean silicon surface is obtained by etching into the silicon surface for about 20 nm. At the same time, the foreign materials that the above-described trench washing has failed to remove, are removed. Then, annealing in a hydrogen atmosphere is performed. The annealing, performed at 1050° C. in a gas mixture containing Ar and 30% of hydrogen under ordinary pressure, is effective. For removing the natural oxide film or the chemical oxide film efficiently, it is more advantageous to perform the hydrogen annealing under a reduced pressure or under a higher hydrogen partial pressure and at a higher temperature. When the hydrogen annealing is performed under a reduced pressure at a high temperature, surface diffusion of Si atoms is liable to occur. For controlling the trench shape, it is advantageous to perform the hydrogen annealing in the circumstance in which the hydrogen partial pressure is raised to prevent the occurrence of surface diffusion of the Si atoms. It is advantageous to perform the annealing in a hydrogen atmosphere according to the invention, which does not deform the trench shape but flattens the trench side walls. Once a clean silicon surface is obtained, it is also possible to round the trench corners with excellent reproducibility by changing the hydrogen content continuously so that the trench may be deformed efficiently by means of shape control performed upon the silicon surface under the foregoing hydrogen partial pressure, under ordinary pressure or under reduced pressure. The shape control will be described in connection with the third embodiment of the invention.

Third Embodiment

When the last hydrogen annealing according to the first or second embodiment is performed under a reduced pressure, surface roughness reduction is accelerated. A pressure of 760 Torr (760×133.3 Pa) or lower, e.g. around 10 Torr (10×133.3 Pa), may be used. However, when the surface roughness is reduced too fast, the trenches may be deformed to become bow-shaped, as illustrated by the trench cross section of FIG. 4. A hydrogen annealing pressure of 100 Torr (100×133.3 Pa) or higher is preferred. Usually, the silicon crystal deforms fast under the reduced pressure. Therefore, according to the third embodiment, it is necessary to adjust the pressure, the temperature, and the annealing period more finely and properly than according to the first embodiment. If compared at the same silicon substrate temperature, the speed of silicon deformation under a pressure of 40 Torr (40×133.3 Pa) is 10 times greater than the silicon deformation speed under ordinary pressure. Therefore, if the hydrogen annealing is performed at 1050° C. under 40 Torr (40×133.3 Pa), the annealing should be finished within one-tenth the time of annealing according to the first embodiment. In short, the annealing should be finished within several seconds.

Fourth Embodiment

According to the fourth embodiment, a silicon substrate 1, with many trenches formed therein and in the state as shown in FIG. 2, is positioned in a in a hydrogen atmosphere within a vapor-phase reaction furnace. The susceptor temperature in the vapor-phase reaction furnace is kept at 800° C. Silicon substrate 1 is rotated at 30 times per minute, and the temperature is raised at 2° C./sec. for 75 seconds. After being heated up to 950° C., silicon substrate 1 is annealed for 1 minute in the hydrogen atmosphere under ordinary pressure. HCl gas fed at the flow rate of 200 ml/min is diluted with hydrogen fed at a flow rate of 40 l/min. The diluted HCl gas is fed at 950° C. for 90 seconds and the silicon surface in the trench is etched to a depth of 25 nm. Then, the annealing atmosphere is returned to pure hydrogen and the temperature is raised at 2° C./sec. for 50 seconds. Silicon substrate 1 is annealed at 1050° C. for 15 seconds. Then, the temperature is lowered at 2° C./sec. for 125 seconds, the rotation of silicon substrate 1 is stopped at 800° C., and silicon substrate 1 is take out of the furnace. A sacrificial oxide film is formed on trench inner wall 4 and then removed.

FIG. 1.8 shows an experimental trench-gate MOSFET. FIG. 6A is a histogram of the breakdown voltage distribution of the experimental trench-gate MOSFET, the silicon substrate of which is not treated in the vapor-phase reaction furnace. FIG. 6B is a histogram of the breakdown voltage distribution of the experimental trench-gate MOSFET, the silicon substrate of which is treated in the vapor-phase reaction furnace according to the invention. In FIGS. 6A and 6B, the horizontal axis represents the breakdown voltage and the vertical axis the frequency of occurrence. On the whole, the breakdown voltages for the treated silicon substrate according to the invention (FIG. 6B) are higher than the breakdown voltages for the untreated silicon substrate (FIG. 6A) by about 5 V.

In addition to the trench formation for manufacturing trench-gate MOSFETs according to the first through fourth embodiments, the invention is applicable to forming trenches for burying, in the drift region of a MOSFET after the trench formation, the constituent regions of one conductivity type in an alternating conductivity type layer. The invention is applicable also to forming minute trenches for trench capacitors and such semiconductor devices, which utilize the trenches, and for trench device separation.

What is claimed is:

1. A method for manufacturing a semiconductor device including a semiconductor substrate having a major surface in which trenches are defined, the method comprising the steps of:
   a. providing an insulator film on the major surface of the semiconductor substrate;
   b. shaping the insulator film with a predetermined pattern to provide a mask; and
   c. performing trench etching using the mask to form the trenches;
   d. thermally treating the device in a non-oxidizing and non-nitriding atmosphere in an initial thermal treatment;
   e. etching inside the trenches using a halogen-containing gas to smooth the inside of the trenches; and
   f. thermally treating the device in a non-oxidizing and non-nitriding atmosphere in a further thermal treatment.

2. The method according to claim 1, wherein the trenches have a width which is 2.0 µm or less and a depth which is 0.5 µm or more.

3. The method according to claim 2, wherein the trenches have a width which is 1.0 µm or less.

4. The method according to claim 1, wherein etching inside the trenches in step (e) comprises anisotropic dry etching.

5. The method according to claim 1, wherein the halogen-containing gas comprises one of hydrogen chloride gas or chlorine gas.

6. The method according to claim 5, wherein etching inside the trenches in step (e) includes using hydrogen for a carrier gas and etching the inside of the trenches in an atmosphere under a pressure ranging between 100×133.3 Pa and 760×133.3 Pa and a temperature ranging between 900° C. and 1050° C.

7. The method according to claim 5, wherein etching inside the trenches in step (e) is performed so that the sidewalls of the trenches have a taper angle which ranges between 87 degrees and 90 degrees.

8. The method according to claim 1, further comprising the steps of:
   g. forming a sacrificial oxide film on inner walls of each trench after thermally treating in step (f);
   h. removing the sacrificial oxide film; and
   i. forming a gate oxide film on the inner walls of each trench.

9. The method according to claim 8, wherein the gate oxide film comprises a silicon oxide film.

10. The method according to claim 9, wherein the gate oxide film comprises a laminate comprising a silicon nitride film.

11. The method according to claim 1, further comprises the step of rotating the substrate.

12. The method according to claim 1, wherein thermally treating in step (d) or in step (f) is performed in a carrier gas atmosphere under a pressure of 760×133.3 Pa or lower and a temperature ranging between 900° C. and 1050° C.

13. The method according to claim 1, wherein the thermally treating in step (d) and in step (f) are performed in a carrier gas atmosphere under a pressure of 760×133.3 Pa or lower and a temperature ranging between 900° C. and 1050° C.

14. The method according to claim 1, wherein the non-oxidizing and non-nitriding atmosphere used in thermally treating in step (d) and in step (d) includes a gas selected from the group consisting of hydrogen, argon, and helium.

* * * * *